United States Patent [19]
Vatis

[11] Patent Number: 4,602,226
[45] Date of Patent: Jul. 22, 1986

[54] APPARATUS FOR THE GATED MODULATION OF A RADIO-FREQUENCY CARRIER SIGNAL

[75] Inventor: Dimitrios Vatis, Schenectady, N.Y.

[73] Assignee: General Electric Company, Schenectady, N.Y.

[21] Appl. No.: 714,406

[22] Filed: Mar. 21, 1985

[51] Int. Cl.$^4$ .............................................. H03C 1/00
[52] U.S. Cl. .................................. 332/31 R; 332/10; 332/40; 332/41; 455/42
[58] Field of Search ................. 332/9 R, 10, 16 R, 17, 332/21, 31 R, 40, 22, 41; 343/17.2 R; 375/44; 455/42, 78, 79, 82, 83, 110

[56] References Cited

U.S. PATENT DOCUMENTS 3,697,892 10/1972 Lawrence et al. .................. 332/9 R Primary Examiner—Eugene R. LaRoche
Assistant Examiner—James C. Lee
Attorney, Agent, or Firm—Geoffrey H. Krauss; James C. Davis, Jr.; Marvin Snyder

[57] ABSTRACT

Apparatus for the gated modulation of an RF carrier signal uses a balanced circuit for amplitude-modulating the carrier signal, and a circuit having a predetermined minimum on-off amplitude-ratio for providing respective very high attenuation and very low attenuation to the modulated carrier signal responsive to respective off and on levels of a binary logic gate signal. Each of the RF carrier, modulation and gate signals may be individually buffered and/or amplified prior to use of that signal in one of the modulation or gate processes. The modulated RF carrier signal and/or the gated RF signal may also be buffered and/or amplified prior to being respectively gated in, or output from, the apparatus. Each of the buffer-amplifiers, except the gate signal buffer-amplifier, may itself be gated responsive to the gate signal, to provide a desired degree of apparatus output signal on-off ratio.

23 Claims, 10 Drawing Figures

Fig. 1a

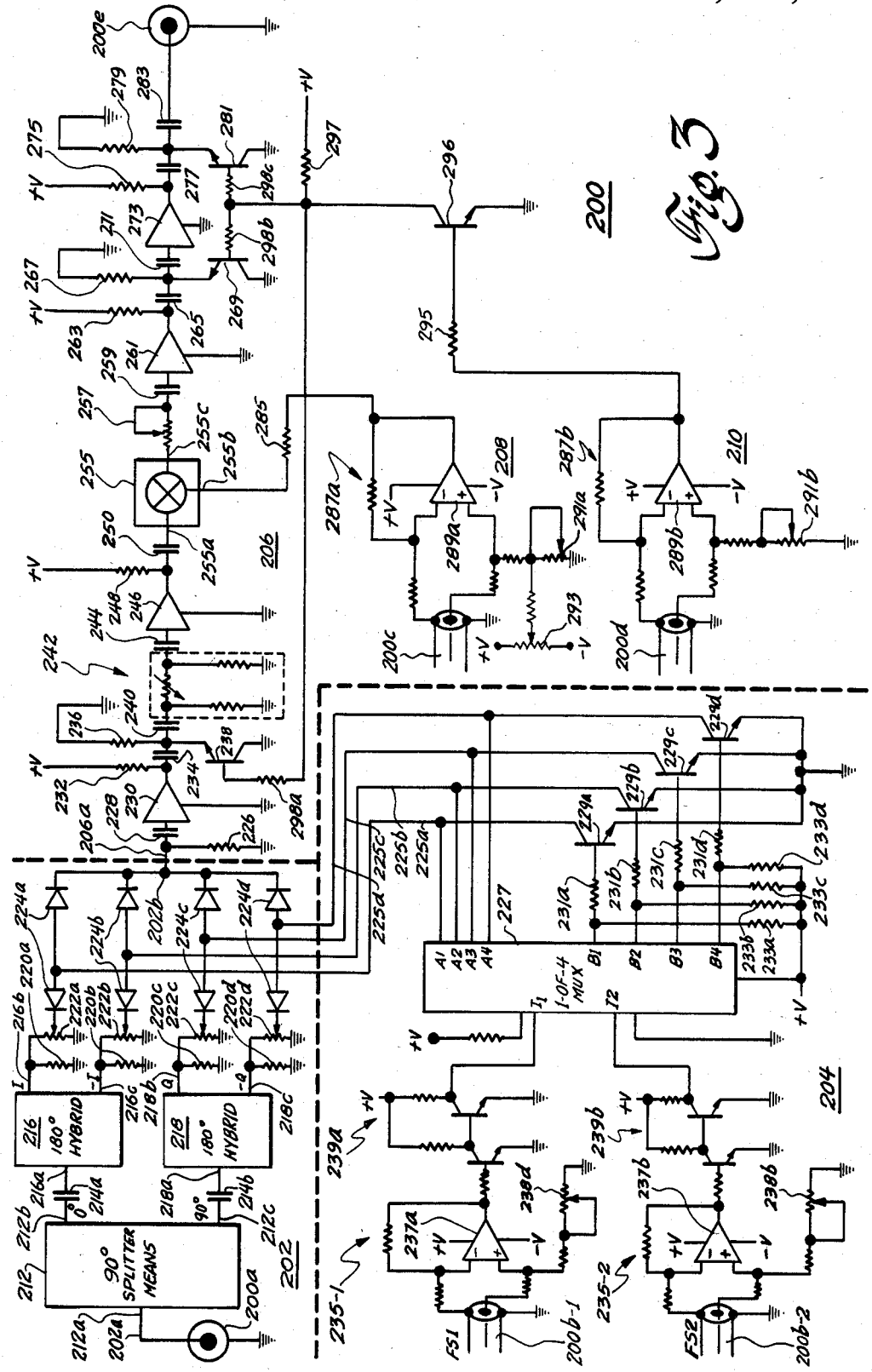

4,602,226

APPARATUS FOR THE GATED MODULATION OF A RADIO-FREQUENCY CARRIER SIGNAL

BACKGROUND OF THE INVENTION

The present invention relates to apparatus for modulating a radio-frequency (RF) signal and, more particularly, to novel gated RF carrier modulation apparatus.

Apparatus for providing a gated modulated RF carrier signal is often required in the communications systems and allied arts. One known use of such apparatus is in the transmitter portion of an RF spectrometer utilized as part of a magnetic resonance spectometry and imaging system, such as described in co-pending application Ser. No. 714,405, filed on the same date as the present application and incorporated herein by reference in its entirety. Such gated modulator apparatus must provide a maximum isolation between input and output, i.e. have extremely high insertion loss, in the ungated ("gate open") state, yet provide minimum insertion loss in the gated (or "closed") state. Similarly, the amplitude of the RF carrier wave, when the modulator is in the gated condition, should follow the modulation signal waveform with a high degree of linearity.

BRIEF SUMMARY OF THE INVENTION

In accordance with the invention, novel apparatus for the gated modulation of an RF carrier signal comprises: balanced means for amplitude-modulating the carrier signal; and means having a predetermined minimum on-off amplituderatio for providing respective very high attenuation and very low attenuation to the modulated carrier signal responsive to respective off and on levels of a binary logic gate signal. Each of the RF carrier, modulation and gate signals may be individually buffered and/or amplified prior to use of that signal in one of the modulation or gate processes. The modulated RF carrier signal and/or the gated RF signal may also be buffered and/or amplified prior to being respectively gated in, or output from, the apparatus. Each of the buffer-amplifiers, except the gate signal buffer-amplifier, may itself be gated responsive to the gate signal, to provide a desired degree of apparatus output signal on-off ratio.

In presently preferred embodiments, active or passive modulators may be used, as may a plurality of gate stages. Phase-modulation of the RF carrier may be utilized, either with or without amplitude-modulation.

Accordingly, it is one object of the present invention to provide novel gated RF carrier signal modulation apparatus.

This and other objects of the present invention will become apparent upon a reading of the following detailed description of the invention, when considered in conjunction with the drawings.

BRIEF DESCRIPTION OF THE DRAWINGS

FIG. 1' is a schematic block diagram of the general form of the apparatus of the present invention;

FIG. 1a is a schematic block diagram of one presently preferred embodiment of the gated modulator apparatus;

FIG. 3 is a schematic block diagram of a presently preferred gated modulator embodiment also capable of imparting selectable-phase modulation to the RF carrier signal.

DETAILED DESCRIPTION OF THE INVENTION

Figure 1:
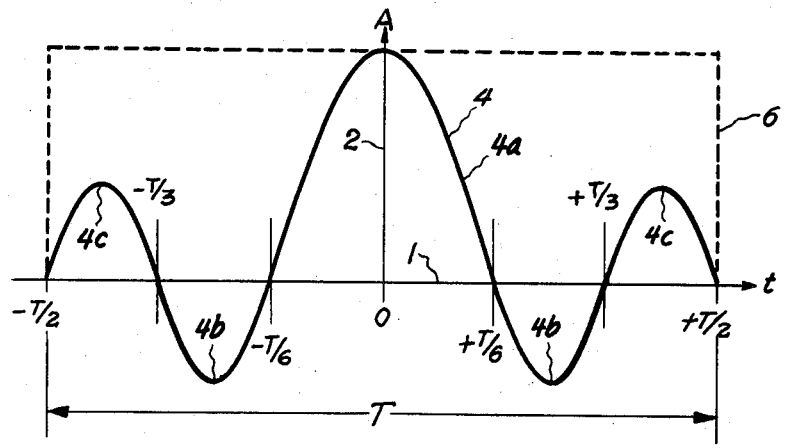
FIG. 1 is an amplitude-time plot of the gated modulation envelope of a typical signal to be provided by the apparatus of the present invention.
Figure 1:
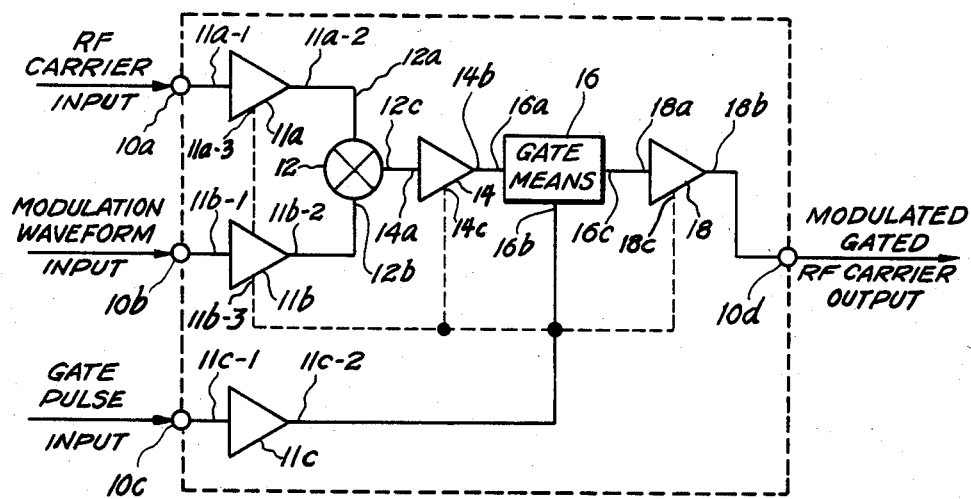

Referring initially to FIG. 1, wherein time t is plotted along abscissa 1 and amplitude A is plotted along ordinate 2, an illustrative RF carrier signal modulation envelope 4 is displayed. Modulation envelope 4 is illustratively of the form $\sin(x)/x$ and is present only during the non-zero amplitude portion of a gating "boxcar" signal 6. The gating envelope 6 has a time duration T specifically established so that the main lobe 4a, the first pair of side lobes 4b and the second pair of side lobes 4c are present (the third and subsequent pairs of side lobes being "ungated" to an essentially zero amplitude, during times prior to time $(-T/2)$ and after time $(+T/2)$). It will, of course, be understood that this amplitude envelope is shown without the RF carrier signal being modulated, to simplify the Figure, and that a greater or lesser number of side lobes, or other waveforms, etc. can equally as well be used.

Referring now to FIG. 1', apparatus 10 for performing the gated modulation function receives the RF carrier input signal, to be modulated and gated, at a first input 10a. The modulation waveform input signal is received at a second input 10b. The gate pulse input signal is received at a third input 10c. The gated and modulated RF carrier output signal appears at an output 10d. Each of the signals at inputs 10a, 10b and/or 10c, can be buffered (i.e. isolated from the effects of subsequent signals/stages) and/or amplified by an associated one of buffer-amplifier means 11a, 11b and/or 11c to provide a desired and/or required signal level at each subsequent connection node in the apparatus. Thus, the RF input signal at connection means 10a can be applied to the input 11a-1 of a first buffer-amplifier means 11a. If buffer-amplifier means 11a is utilized, its output 11a-2 is connected to a first input 12a of a modulation means 12; if first buffer-amplifier means 11a is not utilized, input means 10a is directly connected to modulation means first input 12a. The modulation waveform input signal at input connection means 10b may be connected to the input 11b-1 of a modulation buffer-amplifier means 11b. If buffer-amplifier means 11b is utilized, the output 11b-2 thereof is connected to a modulation means second input 12b. If buffer-amplifier means 11b is not utilized, input means 10b is directly connected to second modulation means input 12b. The modulation means output 12c, at which a modulated RF carrier signal appears, may be connected to the input 14a of another buffer-amplifier means 14; if used, the output 14b of the additional buffer-amplifier means 14 is connected to the modulated RF input 16a of a gate means 16. If means 14 is not used, output 12c is directly connected to input 16a. The gating control input 16b of gate means 16 receives the gate pulse signal, either from the output 11c-2 of a gate pulse buffer-amplifier means 11c, itself having its input 11c-1 connected to the gate pulse input signal connection means 10c, or directly from input means 10c if buffer-amplifier means 11c is not utilized. The gated, modulated RF carrier signal is provided at gate means output 16c, and may be applied to the input 18a of a buffer-amplifier means 18. If buffer-amplifier means 18 is utilized, the output 18b thereof is connected to the modulated gated RF carrier output signal connection means 10d. If buffer-amplifier means 18 is not utilized, gate means output 16c is directly connected to the apparatus output means 10d.

In accordance with one principle of the present invention, at least one of the buffer-amplifier means not associated with the gate pulse input signal can be gated, in addition to gate means 16, to increase the gated, modulated RF carrier output signal on/off ratio. Thus, the gate pulse signal at gate means control gating input 16b can also be applied to one, or more, of the gating control inputs 11a-3 or 11b-3 of buffer-amplifier means 11a or 11b and/or the gating control inputs 14c or 18c of buffer-amplifier means 14 or 18.

Figure 1A:
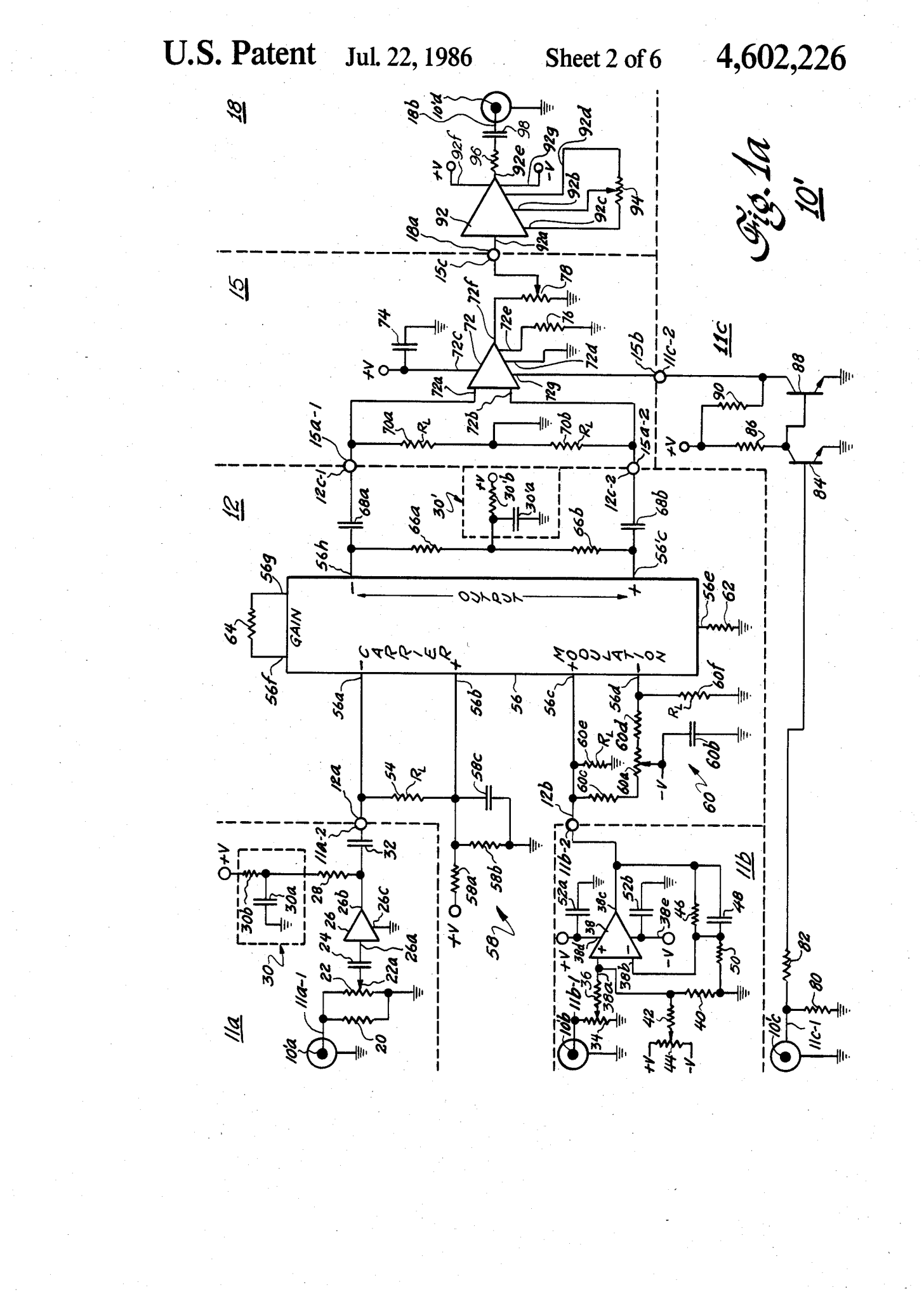

Referring now to FIG. 1a, a first embodiment 10' of my novel gated modulator apparatus combines buffer-amplifier means 14 and gate means 16 in a differential-to-single-ended gated amplifier means 15. The RF signal input connector 10'a is connected to the input 11a-1 of a first buffer-amplifier means 11a. The RF input signal appears across a terminating resistor 20, having a value $R_L$ equal to the terminating impedance of the means, e.g. coaxial cable and the like, conveying the signal to input connector 10a. An adjustable signal means 22, such as a low-reactance potentiometer and the like, of value substantially, e.g. at least one order of magnitude, greater than the value of resistor 20 is connected in shunt with the terminating resistor; the wiper contact 22a of means 22 is set to provide the desired magnitude of the input RF carrier signal through a DC blocking capacitor 24 to the input 26a of an RF amplifier, such as a standard integrated circuit unit amplifier, e.g. type MWA-130 available from Motorola Semiconductor Corp. or the like. The wideband unit amplifier output 26b is connected through a load resistance 28c and, typically, a decoupling means 30, to a source of operating potential $+V$, with respect to a common circuit potential connection 26c. Decoupling means 30, typically comprising a shunt bypass capacitance element 30a and a series resistance or inductance element 30b, may-be utilized, although not specifically shown, between any positive potential $+V$ or negative potential $-V$ terminal and the associated positive or negative potential supply means, in accordance with well-known engineering practice. The amplified RF signal appearing across load resistance 28 is coupled through DC-blocking capacitance 32 to the first buffer means output terminal 11a-2 and thence to the first input 12a of the modulation means 12.

The modulation signal means 10'b is connected across a potentiometer 34, having its adjustable wiper connected through an input resistance element 36 to a non-inverting, $+$input 38a of an operational amplifier 38. Input 38a is also connected through a resistance element 40 to circuit common potential, and through another resistance element 42, to the wiper arm of a potentiometer 44 connected between the positive and negative supply potentials $+V$ and $-V$. An inverting-input 38b of the operational amplifier is connected through a feedback resistance element 46, shunted by a feedback compensation capacitance element 48, to the operational amplifier output 38c, and also through a gain-setting resistance element 50 to circuit common potential. Operational amplifier 38 receives positive and negative operating potential respective at DC inputs 38d and 38e, respectively, each of which is bypassed by an associated one of capacitive element 52a and 52b, respectively. The operational amplifier output 38c is connected to the second buffer-amplifier means output terminal 11b-2 and thence to the modulation input 12b of modulation means 12.

The RF carrier signal at input 12a appears across a terminating resistor 54, typically of the same termination resistance value $R_L$, e.g. about 50 ohms. This termination resistor is coupled between the negative and positive carrier signal input terminals 56a and 56b of an RF modulator integrated circuit 56, such as a standard MC1496 integrated circuit, available from Motorola Semiconductor Corp., or the like. The carrier input terminals are maintained at a positive DC bias by means of a first bias network 58, comprised of voltage-divider resistance elements 58a and 58b, and an RF carrier frequency bypass capacitance element 58c. Modulation input terminals 56c and 56d of the modulator integrated circuit are DC biased by a second biasing circuit 60, while the modulation signal is directly introduced to modulation input terminal 56c. Second biasing means 60 includes a potentiometer 60a having the wiper arm thereof receiving the negative supply potential $-V$, and bypassing the ground potential by a capacitive element 60b. The total resistance of potentiometer 60a is in series with first and second fixed resistance elements 60c and 60d between the modulation input terminals 56c and 56d; termination resistance elements 60e and 60f are connected from the associated one of modulation terminals 56c and 56d to circuit common potential. A bias-setting resistance element 62 is connected to a bias terminal 56e of the modulator means, while a gain-setting resistance element 64 is connected between an associated pair of gain-setting terminals 56f and 56g. The modulating means differential output terminals 56h and 56i are connected through load resistors 66a and 66b, respectively, to a source of positive operating potential, such as the operating $+V$ potential source, decoupled through another decoupling means 30'. The differential output signals at terminals 56h and 56i are each respectively coupled through an associated one of coupling capacitors 68a and 68b to the associated one of output terminals 12c-1 and 12c-2, respectively connected to the associated one of input terminal 15a-1 or 15a-2 of the gated amplifier means 15.

Gated amplifier means 15 includes first and second input terminating resistors 70a and 70b, respectively connected between ground potential and an associated one of input terminals 15a-1 and 15a-2; the input terminals are also connected to an associated one of the differential inputs 72a and 72b of a gateable amplifier means 72. Advantageously, differential-input gain-controlled amplifier means 72 is an integrated circuit amplifier, such as a standard MC1445 integrated circuit, available from Motorola Semiconductor Corp. or the like. Gated amplifier means 72 receives positive operating potential $+V$ at a terminal 72c, which may be bypassed for RF by a capacitive element 74; potential +V is applied with respect to common potential at terminal 72d. The gain and/or bias of amplifier means 72 may be set by an associated resistance element 76, at a gain and/or bias terminal 72e. The amplifier output 72f appears across the total resistance of a potentiometer 78, having its wiper arm connected to amplifier output terminal 15c, and utilized to establish the maximum gain of stage 15. The gain of the output 15c signal, with respect to time, is established by the magnitude of a gating signal provided at the gate control signal input 15b, and thence at a control terminal 72g, from the output 11c-2 of the gate pulse buffer-amplifier means 11c.

In the present gated modulator embodiments, a binary logic signal is applied to gate signal input means 10c, whereby gate signal buffer-amplifier means 11c can be any suitable logic buffer, can be of inverting- or non-inverting-type, and can maintain, or translate, input logic levels to the same, or other, output logic levels, as necessary. Thus, the input gate logic signal appearing across a terminating resistance element 80 provides a base current through a resistance element 82 to the base electrode of a first transistor element 84. The inverted logic signal appearing across an associated load resistance 86 is applied to the input of a second logic transistor element 88. The double-inverted (or original-polarity) logic signal appearing across load resistance 90 is also present at output terminal 11c-2, and is coupled to the gain-control input 72g of amplifier means 72. Thus, for a high-logic-level input signal, means 72 is provided with the proper potential, e.g. a high logic "1" level, for a "gated-on" condition, wherein the signal appears at output 15c with a relatively high level; conversely, for a low-logic-level at input terminal 10c, a substantially zero voltage signal is provided to control terminal 72g to cause a substantially zero amplitude signal to be provided at output terminal 15c. Responsive thereto, output buffer-amplifier means 18 provides the desired amplitude of the gated, modulated RF carrier signal at apparatus output terminal 10d.

Output buffer-amplifier means 18 includes a high-speed amplifier means 92, having a suitable upper frequency, with respect to the RF carrier signal frequency in use. The gated, modulated signal from input terminal 18a is provided to the amplifier input 92a. The amplifier DC response is established by the potential at a zero-offset terminal 92b. This DC voltage is set at the wiper arm of a potentiometer 94, having its resistance element connected between amplifier offset-potential-establishing terminals 92c and 92d. Amplifier means 92, which can be an LH0033 integrated circuit, available from National Semiconductor Corp. or the like, receives positive and negative operating potentials +V and −V, respectively, and respective supply terminals 92f and 92g. The amplifier output 92e is connected through a terminating network of series resistance element 96 and capacitive element 98, to the amplifier output 18b, and thence to apparatus output connection means 10'd.

Figure 1B:
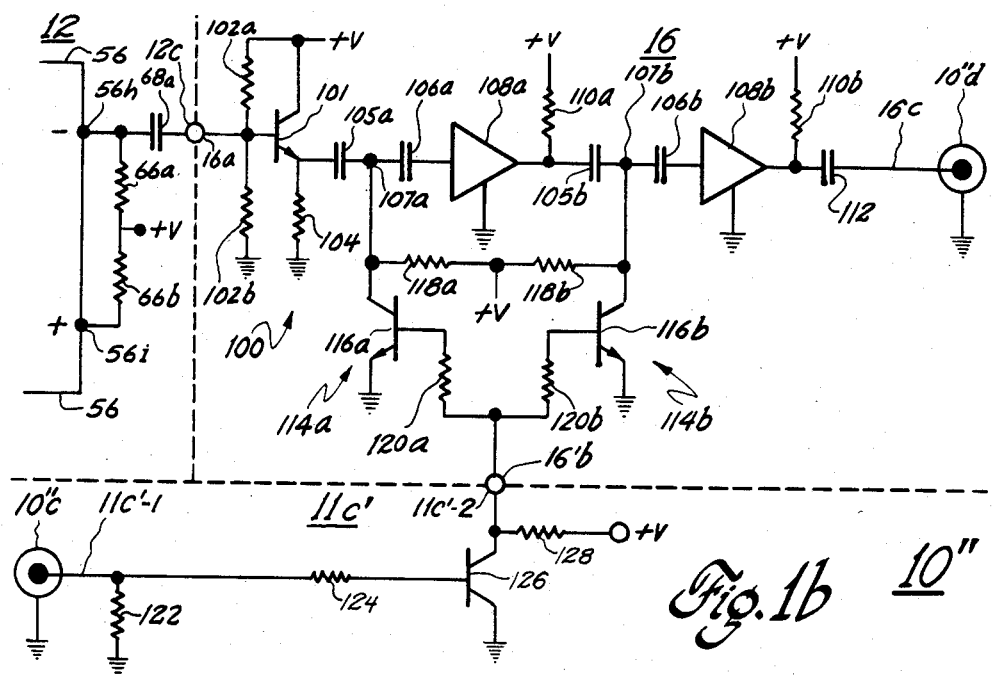
FIG. 1b is a schematic block diagram of a portion of another presently preferred gated modulator embodiment.

Referring now to FIG. 1b, an alternative preferred embodiment 10'' utilizes gating means 16, and gate buffer means 11c', in place of gated amplifier means 15 and gate input signal buffer-amplifier 11c, of FIG. 1a. Gate means 16 has an unbalanced input 16a, whereby a single balanced modulator means output terminal 12c is utilized, connected through the single coupling capacitor 68a to the modulator integrated circuit output terminal 56h. It will be understood that the circuitry to the left of the balanced modulator integrated circuit output terminals may be the same as that circuitry shown in FIG. 1a.

Gate means 16 includes an emitter-follower buffer circuit 100 which receives the modulated RF carrier signal from input 16a, for coupling to the base electrode of a bipolar transistor 101. The collector electrode of transistor 101 is connected to the positive supply potential +V, which potential is connected through a first bias resistance 102a to the transistor base electrode, which is itself connected through a second bias resistance 102b to ground potential. The transistor emitter electrode is connected through an emitter resistance 104. Transistor 101 provides an emitter-follower buffering the output of the balanced modulator, prior to the introduction of the buffered signal into a two-stage gated amplifier. Each section of the gated amplifier includes a pair of series-connected capacitive elements 105a and 106a, connected between the emitter-follower output and the input of a first unit amplifier 108a, or capacitive elements 105b and 106b, connected between the output of the first amplifier and the input of a second unit amplifier 108b. The load resistance 110a or 110b associated with each of the unit amplifiers 108a or 108b, respectively, also provides operating potential thereto from the positive operating potential +V source. The second unit amplifier 108b output is coupled through an RF coupling capacitor 112 to gate means output 16c and thence to the gated modulator apparatus output 10''d. Coupling capacitors 105 and 106 are deliberately split so that the common nodes 107a and 107b thereof can each be individually connected to first and second variable impedance means 114a and 114b. Means 114 should provide a low impedance, i.e. as close to a short-circuit as possible, from the associated node 107, to common potential, for minimum output signal in the "gated-off" condition, and should provide a high impedance, i.e. as close to an essentially open circuit as possible, between the associated node 107, and circuit common potential, for minimum attenuation in the "gated-on" condition. Thus, means 114a and 114b have binary operating conditions, with respect to nodes 107, at the desired RF carrier frequency. Each of means 114 may be comprised of a bipolar transistor 116a or 116b, having its collector electrode connected both to the associated gate means node 107a or 107b, and through a load resistance 118a or 118b, to a source of operating potential +V. The emitter electrodes of transistors 116a and 116b are connected to circuit common potential, while the base electrodes thereof are connected through an associated one of base resistors 120a or 120b, to the gate means control signal input terminal 16b, and thence to the output terminal 11c'-2 of the gate signal buffer means.

The gate signal appears at input terminal 10''c and, thus, at the gate signal buffer means input 11'-1. The gate signal, across input terminating resistance 122, is applied through base resistance 124 to the base electrode of a logic driver transistor 126. Because of the signal inversion in each of the means 114, only a single logic signal inversion is necessary in buffer means 11c', and only a single logic inverter device 126 is utilized. Thus, when the gated modulator output 10''d signal is to be at an essentially zero level, i.e. gate means 16 is to be in a high attenuation condition, a low-logic-level "0" signal is provided at gate input 10''c. Responsive thereto, transistor 126 is in the cut-off condition, whereby substantially all the current flowing through a load resistance 128, from potential +V, flows through output terminal 11c'-2 into gate means input control terminal 16b and then through base resistances 120a and 120b into the base electrodes of control devices 116a and 116b. The value of resistance 128 and resistances 120a and 120b are established such that, responsive to transistor 126 being in the cut-off condition, transistors 116a and 116b are essentially in the saturated condition, providing a very low RF impedance, to circuit common, from each of nodes 107a and 107b. Responsive thereto, the unit amplifiers 108a and 108b (which may be the aforementioned type MWA-120 or MWA-130) provide substantially zero magnitude output signals. Conversely, when a high-logic-level "1" signal appears at gate input 10"c, current is caused to flow through base resistance 124 and into transistor 126. Resistance 124 is so scaled as to cause transistor 126 to be driven into the saturated condition, whereby a relatively low voltage is provided at buffer means output terminal 11c'-2 and gate means control input terminal 16b. Responsive to this relatively low voltage signal, devices 116a and 116b are placed in the cut-off condition, whereby reltiavely large impedances appear between each of nodes 107a and 107b and circuit common potential. Accordingly, substantially all of the modulated RF carrier signal at the emitter-follower means 100 output is applied to the dual-amplifier chain and the full amplitude-modulated RF carrier is provided at gated modulator means output terminal 10"d.

Figure 1D:
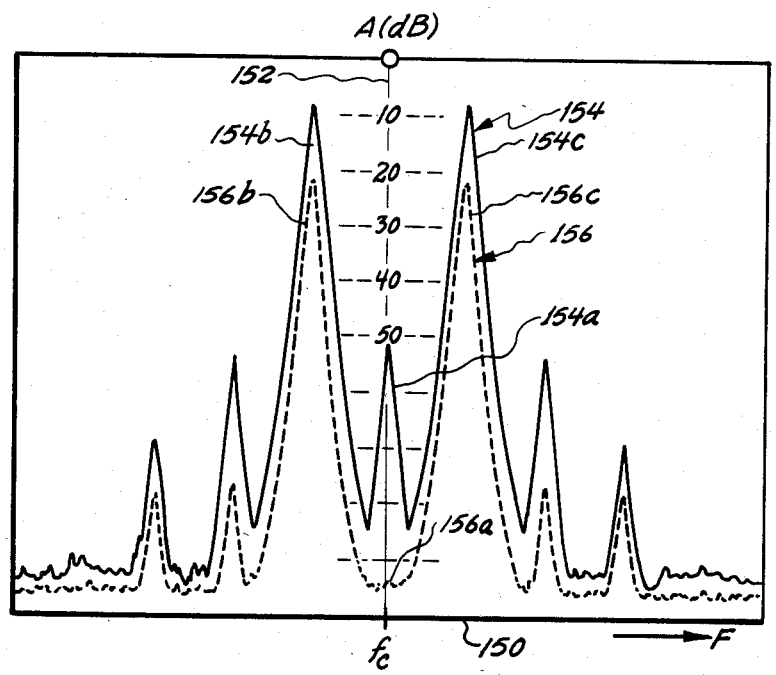
FIG. 1d is a graphical comparison of the frequency spectra of first and second gated output signals, and useful in appreciation of several advantages of the present invention.
Figure 1C:
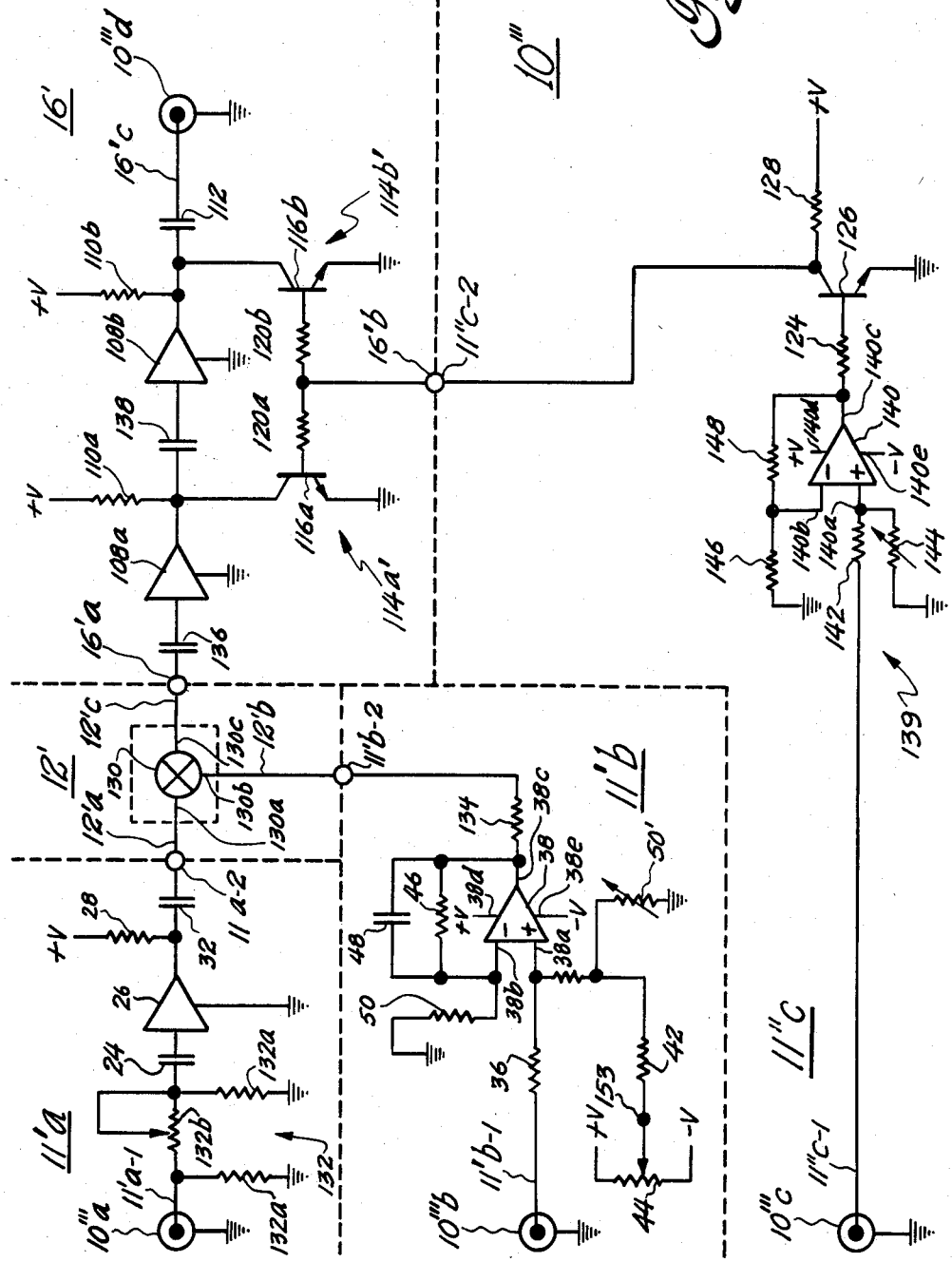
FIG. 1c is a schematic block diagram of yet another presently preferred embodiment.

Referring now to FIG. 1c, a third presently preferred embodiment 10''' of the gated modulator apparatus utilizes a double-balanced mixer (DBM) means 12' as the carrier modulator, to provide for easier carrier balance and minimization of unbalanced carrier feedthrough. Thus, modulation means 12' utilizes a passive double-balanced mixer 130, such as the type SRA-1H available from Mini-Circuits Labs., Brooklyn, N.Y. or the like; the "L.O." input 130a of the DBM is connected to carrier input terminal 12'a, to receive the buffered RF carrier signal at first buffer-amplifier means output terminal 11'a-2. To reduce modulation distortion, DBM 130 is a so-called "high-level" mixer, requiring that the RF signal at the L.O. input 130a typically be an order of magnitude greater than the magnitude required for a "normal-level" passive RF mixer. Accordingly, the +17 dBm. signal required at output 11'a-2 generally necessitates that the RF carrier signal buffer-amplifier means 11'a be present. In the illustrated embodiment, an MWA-130 unit amplifier 26, similar to that used in the embodiment of FIG. 1a, is utilized in conjunction with a variable attenuator means 132. Attenuator 132 is herein illustrated as a π-type attenuator, comprised of equal shunt resistances 132a and a variable series resistance 132b. Unit amplifier means 26 has a fixed gain, such that the actual output level thereof is adjusted by adjustment of the attenuation of means 132, responsive to the actual magnitude of the RF carrier signal provided at first input connector 10'''a. The unit amplifier load resistance 28 is selected to provide the proper RF load to DBM input 130a. A series resistance 134, for properly terminating the "I.F." input 130b of the DBM, is now provided in series with the modulation means second input terminal 12'b and modulation signal buffer-amplifier means output terminal 11'b-2. In other respects, modulation buffer-amplifier means 11'b is substantially similar to means 11b of FIG. 1a.

The modulation means output 12'c is connected to the "R.F." terminal 130c of the DBM, and provides the modulated RF carrier signal to the input terminal 16'a of gate means 16'. To reduce component count, the DC load resistances 118 of the variable impedance means 114 are removed and variable impedance means 114a' and 114b' have the active devices 116 thereof connected to the normal unit amplifier load resistances 110a and 110b. As the variable impedance means are now connected to the output of each unit amplifier, the gate means input impedance is substantially that of unit amplifier means 108a; this substantially-constant impedance is coupled through a DC-blocking capacitance element 136, to gate means input 16'a. Similarly, because DC isolation between the collector of variable impedance device 116b and the input or output terminals of an adjacent unit amplifier, is no longer required, a single coupling capacitor 138 is utilized between the output of first unit amplifier 108a and the input of second unit amplifier 108b. This configuration not only provides a relatively low impedance across the collector-emitter circuits of each of shunt devices 116a and 116b, but at the same time, in the "gated-off" condition, causes the same devices to divert substantially all of the unit amplifier operating current flowing through load resistances 110a and 110b, so that the unit amplifiers are then in a "starved" condition and provide further attenuation to the modulated RF signal. The gate pulse buffer-amplifier means 11"c is still required to provide a single inversion of the input signal, and utilizes inverter transistor 126 for this purpose. A voltage-follower circuit 139 is provided between the third apparatus input means 10'''c and the inverter base resistance 124, to reduce the current required at input 11"c-1, and thus, raise the apparent impedance thereof. Voltage-follower means 139 includes an operational amplifier means 140 (which may be one-half of a dual operational amplifier integrated circuit, the other half of which may be utilized to provide operational amplifier 38 of modulation signal buffer-amplifier means 11'b). The non-inverting input 140a is connected through a first resistance 142 to the third buffer-amplifier means input 11"c-1, while a variable resistance 144 is connected from input 140a to circuit common potential. The inverting input 140b is connected to common potential through a resistance element 146 and through another resistance element 148 to the operational amplifier output 140c. Operating potentials ±V are provided to associated positive and negative potential terminals 140d and 140e. With proper adjustment of variable resistor 144, means 139 provides a non-inverting, unity-gain high-input-impedance voltage follower.

Referring now to FIG. 1d, the frequency F of the gated and modulated signal at the output 10'''d of the apparatus of FIG. 1c is illustrated, with increasing frequency being plotted from left to right along abscissa 150 and with amplitude A (in decibels dB.) being plotted along center ordinate 152. All embodiments contain at least one adjustment for "nulling" the carrier feedthrough of the modulator means: in the circuits of FIGS. 1a and 1b (having the same modulator means input circuitry, i.e. that of circuit 10' in FIG. 1a), the pair of potentiometers 44 and 60a are utilized, in addition to the RF carrier level-setting potentiometer 22; in circuit 10''' of FIG. 1c, potentiometer 44 adjusts the carrier suppression, once the RF carrier level has been set to the correct level with attenuator potentiometer 132b. Thus, if node 153 (see FIG. 1c) were connected to circuit common potential, a typical DBM modulation means 130 might provide the solid response curve 154 in which the residual carrier portion 154a, fed through the circuit, is suppressed on the order of 42 dB. below the peak amplitude of the first lower and upper sidebands 154b and 154c, respectively. However, by suitable adjustment of potentiometer 44 (itself typically carried out with a zero amplitude modulation signal at second input connector 10‴b), a subsequent measurement of the gated and modulated output signal provides a typical response curve 156, shown in broken line, having a residual carrier level 156a which is approximately 70 dB. below the peak amplitude of the signal lower and upper sidebands 156b and 156c, respectively. Although a somewhat higher insertion loss may obtain with optimal carrier balance, the additional loss, on the order of 10 dB., is easily overcome by additional gain one or both of subsequent unit amplifiers 108, and the optimized circuit still provides up to 30 dB. better carrier suppression.

Figure 2:
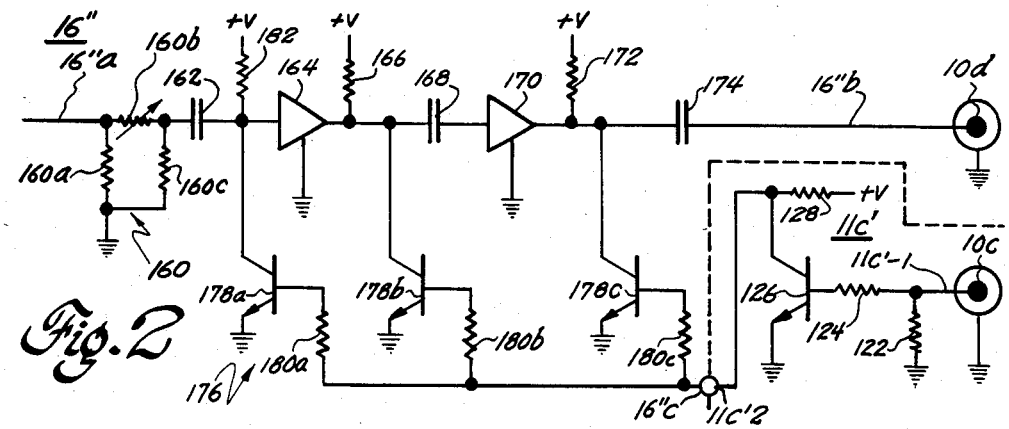
FIG. 2 is a schematic block diagram of an alternate gating portion of the apparatus.

Referring now to FIG. 2, an alternate gate means embodiment 16″a receives the modulated RF carrier signal at an input 16″a, receives the gating input signal at gate input 10c, and provides the gated modulated RF carrier signal at output 10d. The RF carrier signal first traverses an attenuator means 160, illustratively of the π-type having equal-resistance shunt elements 160a and a variable series resistance 160b. After the modulated RF carrier signal level has been-set by attenuator means 160, the signal is coupled through a capacitor 162 to the input of a first unit amplifier 164. The amplified signal, appearing across a first load resistor 166, is coupled through another capacitor 168 to the input of a second unit amplifier 170. The final signal, appearing across load resistor 172, is coupled through a capacitor 174 to gate means output 16″b and thence to the apparatus output 10d. To provide increased on-off ratios, three variable impedance shunt elements 178 are utilized. Each of the shunt elements 178 is illustratively a transistor device, with first transistor 178a having the collector-emitter circuit thereof connected in shunt with the input of first unit amplifier 164, second transistor device 178b having its collector-emitter circuit coupled in shunt with the output of the first unit amplifier, and third transistor device 178c having its collector-emitter circuit coupled in shunt with the output of second unit amplifier 170. The base electrode of each of the three transistors 178a-178c is connected through an associated one of base resistors 180a-180c, to the gate means control input 16″c. Gate signal buffer-amplifier means 11c′ is substantially identical to the gate buffer-amplifier means of FIG. 1b. A load resistor 182 may be required for transistor 178a, if a proper DC signal is not present at the input of first unit amplifier 164; unit amplifier load resistors 166 and 172 also function as the load resistors for gating devices 178b and 178c, respectively.

Figure 2A:
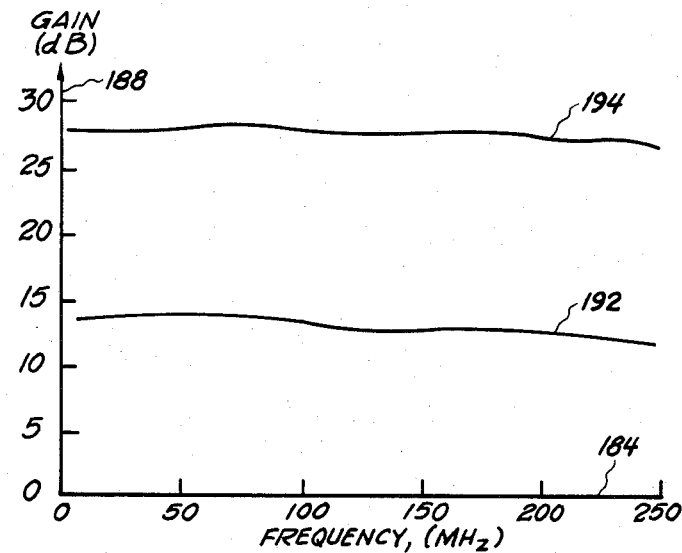
FIGS. 2a and 2b are graphical illustrations of the gain and on-off ratio, respectively, with respect to frequency, of the various embodiments.
Figure 2B:
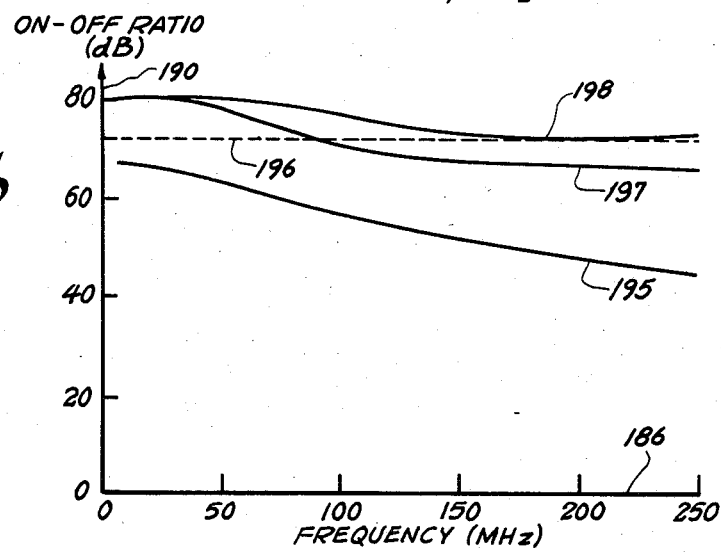

Referring now to FIGS. 2a and 2b, wherein frequency is plotted for increasing values along respective abscissae 184 and 186, gating means forward gain is plotted in increasing decibels along ordinate 188 and gating means on-off ratio is plotted, in decibels, along ordinate 190. It will be seen that a single unit amplifier (using a single MWA-130 integrated circuit amplifier) has a relatively flat gain vs. frequency response curve 192 over a frequency span on the order of 2.5–250 MHz. (where the lower frequency of interest can be reduced if larger coupling capacitance is used). It will also be seen that a two-stage gate means, utilizing a pair of MWA-130 unit amplifiers, has a gain vs. frequency curve 194 which is equally as flat over the same frequency range. However, due to the lower impedance of parasitic shunt impedances and the higher reactance of series impedances at increased frequency, the on-off ratio response is more frequency dependent. If only a single switched device, e.g. only transistor 178c, is used (and devices 178a and 178b are cut-off or disconnected), the on-off ratio curve 195 obtains; the on-off ratio falls below 60 dB. for frequencies greater than about 70 MHz. and the unit provides a maximum on-off ratio which never exceeds 70 dB. (the level shown by broken line 196). By utilization of a pair of shunt gating devices 178b and 178c, the on-off ratio curve 197 is obtained, with low-frequency ratios of about 80 dB. and ratios in excess of 70 dB. below about 90 MHz. Utilization of all three switching devices 178a, 178b and 178c results in on-off ratio performance plotted along curve 198, with a minimum ratio of at least 70 dB. over the full frequency range up to 250 MHz. and 80 dB. on-off ratios for frequencies less than about 50 MHz.

Referring finally to FIG. 3, gated modulator apparatus 200 is presently preferred for gating amplitude and discrete-phase-step modulated RF carrier signals for magnetic resonance imaging and spectroscopy systems. The substantially-constant-amplitude RF carrier signal is received at a first input connector 200a for introduction into the input 202a of a discrete-phase-step modulation section 202. The phase shift imparted to the RF carrier signal by section 202 is controlled to one of four values by a phase-selection section 204, responsive to first and second phase shift FS1 and FS2 signals received at coaxial input connections 200b-1 and 200b-2, respectively. The selected-phase RF signal appears at output 202b and enters the gated amplitude-modulating section input 206a. After gated amplification in section 206, the signal is amplitude-modulated responsive to a modulation signal provided at input cable 200c and buffered in section 208. The amplitude-modulated signal is further buffered and again gated responsive to the gate signal provided at a coaxial input 200d and buffered by a gate buffer portion 210. The phase-modluated, amplitude-modulated and gated RF signal is then provided at output 200e.

Section 202 comprises a hybrid phase-quadrature splitter means 212 receiving the RF carrier signal at its input 212a and providing substantially-identical-amplitude signals at first and second outputs 212b and 212c, with a 90° phase shift therebetween. The phase-split signals are coupled through the associated one of coupling capacitors 214a or 214b to the associated input 216a or 218a of first or second 180° hybrid splitter means 216 or 218. A pair of first hybrid output ports 216b and 216c provide first and second phase signals I and −I, respectively at 0° and 180°, with respect to the RF carrier input signal phase, across the associated terminating resistors 220a and 220b. The second 180° hybrid means 218 provides signals at its two output ports 218b and 218c which are quadrature signals Q and −Q, respectively appearir across terminating resistors 220c and 220d, with respective phases of 90° and 270°, with respect to the carrier input phase. One of four potentiometers 222a-222d is connected in parallel with the associated one of terminating resistors 220, and is typically of value at least an order of magnitude greater than the terminating resistance value. The wiper arm of each potentiometer 222 is individually connected to the input of the associated one of four RF switch sections. Each switch section, illustratively utilizing a pair of PIN switching diodes 224a-224d, provides only one of the four I, Q, −I and −Q signals at phase-selecting portion output 202b, responsive to that one of switch selection lines 225a-225d then at a high logic level.

Phase-switching section 204 provides the logic levels on selection lines 225, themselves each connected to an associated one of first output lines A1-A4 of a dual 1-of-4 multiplexer (MUX) means 227 and to the associated collector electrode of control transistors 229a-229d, all having their emitter electrodes connected to circuit common potential. Each of transistors 229 has the base electrode thereof connected through an associated one of series resistors 231a-231d to an associated one of a second set of multiplexer outputs B1-B4. One of pull-up resistors 233a-233d extends from each of outputs B1-B4 to a source of operating +V potential. Only one of the plurality, e.g. four, of lines 225 is at a high-logic 1 level at any time. The determination as to which one of the four A outputs will be at the logic 1 level, and which associated one of the B outputs will simultaneously be at a low logic level, is determined by the state of first and second selection input terminals I1 and I2. The state of the signals at these selection inputs is responsive to the signals coming in at the phase selection FS1 and FS2 lines 200b-1 and 200b-2. Each line signal is terminated by an active terminator means 235-1 or 235-2. Briefly, each of means 235 utilizes an operational amplifier 237a or 237b having a non-inverting output. The gain of each operational amplifier stage is adjusted, by means of an associated rheostat 291a or 292b, for a stage gain of exactly 1, to provide maximum common-mode-rejection (CMR) in each of the terminator circuits. Each terminator circuit 235 is followed by a double-inversion logic buffer means 239a or 239b, to apply the proper logic signal to the associated one of inputs I1 or I2 of MUX integrated circuit 227 (which may be a standard 4052 CMOS integrated circuit or the like).

The substantially-constant-amplitude, selected-phase RF carrier signal appears across terminating resistor 226 at the gated modulator section input 206a. The signal is coupled, through a first capacitor 228, to a first unit amplifier 230. The amplified signal appearing across a first amplifier load resistance 232 is coupled through a coupling capacitor 234 and is present with normal amplitude at a resistance 236 only if a shunting avalanche gating transistor 238 is in an essentially cut-off condition. If the gating transistor 238 is conducting, a relatively small magnitude of RF carrier signal is present across resistance 236. A substantially non-zero buffered signal at resistance 236 will be coupled through capacitor 240 and the level thereof adjusted in a variable attenuator 242, before being coupled by a capacitance 244 into a second unit amplifier 246. The second buffered signal appears across load resistance 248 and is coupled, via capacitance 250, to the RF input 255a of a balanced mixer-modulator means 255. The modulation signal is received at a control input 255b, to provide an amplitude-modulated, phase-selected RF carrier signal at modulator output 255c. A variable resistance 257 facilitates low-reflectance matching to the modulator output impedance, and a subsequent capacitance 259 couples the modulated signal into a third unit amplifier means 261. The third unit amplifier means output signal appears across a load resistance 263, and is coupled through a capacitance 265 to be present with a substantially non-zero amplitude across a resistance 267 only if a second avalanche gating transistor 269 is in the cut-off condition. If an appreciable RF signal is provided across resistance 267, it is coupled through a capacitor 271 to the input of a fourth, and final, unit amplifier means 273. The output of amplifier 273 appears across load resistance 275, and is coupled through capacitor 277 to appear across another resistance 279; the signal across resistance 279 is of substantially non-zero amplitude only if a shunting third avalanche gating transistor 281 is in a cut-off condition. If transistor 281 is not conducting, the RF signal across resistance 279 is coupled through a capacitor 283 to the apparatus output connector 200e.

The amplitude-modulation input signal is provided to modulator control input 255b, through an impedance-setting element 285, from the output of a modulation input signal buffer means 287a. The buffer output signal is responsive to a modulation input signal received via cable 200c. A second buffer means 287b is provided for buffering a gating signal received via cable 200d. Briefly, each of buffer means 287a or 287b includes an operational amplifier 289a or 289b. (It should be understood that, depending upon the response characteristics and degree of isolation required, each pair of operational amplifiers 237a and 237b or 289a and 289b, or all four of the operational amplifiers 237 and 289, can be part of a dual or quad operational-amplifier integrated circuit, if desired.) Each of buffer means 287a or 287b includes a gain-adjustment variable resistance 291a or 291b, for setting common-mode-rejection (CMR). Buffer means 287a also includes a carrier-suppression-setting potentiometer 293, which is, as previously discussed, utilized to establish the DC level at modulator input 255b for optimum suppression of the carrier feedthrough of modulator means 255.

Gating signal buffer means 287b provides a current through resistance 295 to the bass electrode of gate switching ransistor 296. With transistor 296 in the cut-off condition, load resistance 297 provides sufficient current flow through the associated avalanche transistor base resistances 298a, 298b, and 298c to place the three devices 238, 269 and 281 in the saturated condition and provides an extremely low RF signal magnitude at output connector 200e. Conversely, responsive to transistor 296 being in the saturated condition, all of the current flowing through resistor 297 flows through transistor 296 and transistors 238, 269 and 281 are in the cut-off condition, allowing the RF carrier signal to be present at output 200e with an amplitude determined by the amplitude-modulation process; the output RF signal has that one of the discrete phases determined by the phase-selection process.

While several presently preferred embodiments of my novel gated modulator apparatus have been described in detail herein, many modifications and variations will now become apparent to those skilled in the art. It is my intent, therefore, to be limited only by the scope of the appending claims and not by the specific details and instrumentalities presented herein by way of explanation.

What I claim is:

1. Apparatus for the gated amplitude-modulation of a radio-frequency (RF) carrier signal, comprising:
   first means for receiving said carrier signal;
   second means for receiving a modulation waveform signal;
   third means for receiving a gate pulse signal;
   output means for providing a modulated and gated RF carrier output signal from said apparatus;
   modulator means coupled to said first and second means for providing an amplitude-modulated RF carrier signal having an amplitude substantially equal to the product of the amplitudes of both said RF carrier signal and said modulation waveform signal; and gate means for connecting said amplitude-modulated RF carrier signal to said output means with relatively low attenuation and relatively high attenuation, respectively, responsive to said gate pulse signal at said third means being respectively greater than and less than a predetermined level.

2. The apparatus of claim 1, further comprising a buffer-amplifier means for providing at least one of a desired degree of isolation and a desired amplitude level of the modulated RF signal from said modulating means to said gating means.

3. The apparatus of claim 2, further comprising at least one additional buffer-amplifier means connected between at least one of said first and second receiving means and said modulating means for providing at least one of a desired degree of isolation and a desired signal level of the associated one of said RF carrier and modulation signals at said modulating means.

4. The apparatus of claim 3, further comprising another buffer-amplifier means for providing at least one of a desired degree of isolation and a desired signal magnitude to the signal provided to said output means from said gating means.

5. The apparatus of claim 2, further comprising another buffer-amplifier means for providing at least one of a desired degree of isolation and a desired signal magnitude to the signal provided to said output means from said gating means.

6. The apparatus of claim 1, further comprising buffer-amplifier means receiving the gate signal waveform at said third input means for controlling the characteristics of the gate means.

7. The apparatus of claim 6, wherein said gate means includes at least one controllable device shunting the modulated RF signal path from said modulation means to said output means; said buffer-amplifier means causing said at least one controllable device to be controlled respectively between substantially short-circuit and substantially open-circuit conditions responsive to the presence of a respective low level and high level of gate waveform signal at said third input means.

8. The apparatus of claim 7, wherein a plurality of shunt switching devices are utilized.

9. The apparatus of claim 8, wherein the amplitude of the gated modulated RF carrier signal at said output means varies by at least 70 dB. responsive to said gating signal being at opposite ones of the output-enabling and output-disabling conditions.

10. The apparatus of claim 8, wherein three shunting elements are utilized.

11. The apparatus of claim 10, wherein the amplitude of the gated modulated RF carrier signal at said output means varies by at least 70 dB. responsive to said gating signal being at opposite ones of output-enabling and output-disabling conditions.

12. The apparatus of claim 7, wherein each of said shunting elements is an avalanche transistor.

13. Apparatus for the gated modulation of a radio-frequency (RF) carrier signal comprising:
first means for receiving said carrier signal;
second means for receiving a modulation waveform signal;
third means for receiving a gate pulse signal;
output means for providing a modulated and gated RF carrier output signal from said apparatus;
modulator means coupled to said first and second means for providing a modulated RF carrier signal substantially equal to the product of said RD carrier signal and said modulation waveform signal;
gate means for connecting said modulated RF carrier signal to said output means with relatively low attenuation and relatively high attenuation, respectively, responsive to said gate pulse signal at said third means being respectively greater than and less than a predetermined level;
buffer-amplifier means for providing at least one of a desired degree of isolation and a desired amplitude level of the modulated RF signal from said modulating means to said gating means;
at least one additional buffer-amplifier means connected between at least one of said first and second input means and said modulating means for providing at least one of a desired degree of isolation and a desired signal level of the associated one of said RF carrier and modulation signals at said modulating means; and
another buffer-amplifier means for providing at least one of a desired degree of isolation and a desired signal magnitude to the signal provided to said output means from said gating means;
the gain of at least one of said additional and another buffer-amplifier means being varied responsive to the amplitude of the gate signal at said third input means.

14. Apparatus for the gated modulation of a radio-frequency (RF) carrier signal, comprising:
first means for receiving said carrier signal;
second means for receiving a modulation waveform signal;
third means for receiving a gate pulse signal;
output means for providing a modulated and gated RF carrier output signal from said apparatus;
modulator means coupled to said first and second means for providing a modulated RF carrier signal substantially equal to the product of said RF carrier signal and said modulation waveform signal;
gate means for connecting said modulated RF carrier signal to said output means with relatively low attenuation and relatively high attenuation, respectively, responsive to said gate pulse signal at said third means being respectively greater than and less than a predetermined level;
a buffer-amplifier means for providing at least one of a desired degree of isolation and a desired amplitude level of the modulated RF signal from said modulating means to said gating means; and
at least one additional buffer-amplifier means connected between at least one of said first and second input means and said modulating means for providing at least one of a desired degree of isolation and a desired signal level of the associated one of said RF carrier and modulation signals at said modulating means;
the gain of at least one of said additional buffer-amplifier means being varied responsive to the amplitude of the gate signal at said third input means.

15. The apparatus of claim 14, wherein the gain of said at least one additional buffer-amplifier means is switched between an associated one of binary amplitudes.

16. The apparatus of claim 15, wherein a pair of said additional buffer-amplifier means are provided, each operating on one of the signals provided from an associated one of said first and second input means to said modulating means.

17. Apparatus for the gated modulation of a radio-frequency (RF) carrier signal, comprising:
first means for receiving said carrier signal;
second means for receiving a modulation waveform signal;
third means for receiving a gate pulse signal;
output means for providing a modulated and gated RF carrier output signal from said apparatus;
modulator means comprising a balanced modulator coupled to said first and second means for providing a modulated RF carrier signal substantially equal to the product of said RF carrier signal and said modulation waveform signal, and further comprising balance-adjustment means for minimizing the magnitude of the RF carrier signal appearing at an output of said modulator means responsive to a modulation waveform signal of substantially zero magnitude; and
gate means for connecting said modulated RF carrier signal to said output means with relatively low attenuation and relatively high attenuation, respectively, responsive to said gate pulse signal at said third means being respectively greater than and less than a predetermined level.

18. The apparatus of claim 17, wherein said balanced modulator is a double-balanced modulator having first and second inputs each respectively receiving the signal from a respective one of said first and second input means and having a modulated carrier output at which the product of the two input signals appears, with a preselected isolation from the signals at said first and second inputs.

19. The apparatus of claim 18, wherein said double-balanced modulator is an active circuit having a gain greater than one.

20. The apparatus of claim 18, wherein said double-balanced modulator is a passive circuit having a gain less than one.

21. Apparatus for the gated modulation of a radio-frequency (RF) carrier signal, comprising:
first means for receiving said carrier signal;
second means for receiving a modulation waveform signal;
third means for receiving a gate pulse signal;
output means for providing a modulated and gated RF carrier output signal from said apparatus;
modulator means coupled to said first and second means for providing a modulated RF carrier signal substantially equal to the product of said RF carrier signal and said modulation waveform signal;
gate means for connecting said modulated RF carrier signal to said output means with relatively low attenuation and relatively high attenuation, respectively, responsive to said gate pulse signal at said third means being respectively greater than and less than a predetermined level; carrier
means for varying the phase of the RF carrier signal by one of a plurality of predetermined phase-shifts, relative to the phase of the RF carrier signal at said first input means; and
means responsive to additional input signals for selecting the predetermined phase-shift of the RF carrier signal to be applied to said modulator means.

22. The apparatus of claim 21, wherein said plurality of predetermined phase-shifts are four different phase-shift increments, substantially at 0°, 90°, 180° and 270° with respect to the phase of the RF carrier signal at said first input means.

23. Apparatus for the gated modulation of a radio-frequency (RF) carrier signal comprising:
first means for receiving said carrier signal;
second means for receiving a modulation waveform signal;
third means for receiving a gate pulse signal;
output means for providing a modulated and gated RF carrier output signal from said apparatus;
modulator means, coupled to said second means, for providing to said output means a gated and modulated RF carrier signal substantially proportional to the product of said modulation waveform signal and said RF carrier signal, substantially only when said carrier signal is gated to said modulator means; and
gate means for connecting said first means to said modulator means to provide the gated RF carrier signal respectively with relatively low attenuation and relatively high attenuation, responsive to said gate pulse signal at said third means being respectively greater than and less than a predetermined level.

* * * * *